United States Patent
Mirkarimi et al.

(10) Patent No.: US 6,319,635 B1
(45) Date of Patent: Nov. 20, 2001

(54) MITIGATION OF SUBSTRATE DEFECTS IN RETICLES USING MULTILAYER BUFFER LAYERS

(75) Inventors: Paul B. Mirkarimi, Sunol; Sasa Bajt, Livermore; Daniel G. Stearns, Los Altos, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/454,715

(22) Filed: Dec. 6, 1999

(51) Int. Cl.[7] ............................................... G03F 9/00
(52) U.S. Cl. .................................................. 430/5; 378/35
(58) Field of Search ............................. 430/5, 322, 394; 378/34, 35

(56) References Cited

U.S. PATENT DOCUMENTS

| | | | |
|---|---|---|---|
| 4,634,270 | 1/1987 | Yokoo et al. | 355/125 |
| 5,008,156 | 4/1991 | Hong | 428/506 |
| 5,460,908 | 10/1995 | Reinberg | 430/5 |
| 5,780,161 | 7/1998 | Hsu | 428/426 |
| 5,922,497 | 7/1999 | Pierrat | 430/5 |
| 5,928,817 * | 7/1999 | Yan et al. | 430/5 |
| 5,935,737 * | 8/1999 | Yan | 430/5 |

FOREIGN PATENT DOCUMENTS

| 0416517 | 9/1990 | (WO) | G03F/1/14 |
|---|---|---|---|

* cited by examiner

*Primary Examiner*—S. Rosasco
(74) *Attorney, Agent, or Firm*—L. E. Carnahan; Alan H. Thompson

(57) ABSTRACT

A multilayer film is used as a buffer layer to minimize the size of defects on a reticle substrate prior to deposition of a reflective coating on the substrate. The multilayer buffer layer deposited intermediate the reticle substrate and the reflective coating produces a smoothing of small particles and other defects on the reticle substrate. The reduction in defect size is controlled by surface relaxation during the buffer layer growth process and by the degree of intermixing and volume contraction of the materials at the multilayer interfaces. The buffer layers are deposited at near-normal incidence via a low particulate ion beam sputtering process. The growth surface of the buffer layer may also be heated by a secondary ion source to increase the degree of intermixing and improve the mitigation of defects.

26 Claims, 3 Drawing Sheets

MITIGATION OF SUBSTRATE DEFECTS IN RETICLES USING MULTILAYER BUFFER LAYERS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to minimizing defects in components produced by lithography, particularly to the mitigation of substrate defects in reticles or masks utilized in extreme ultraviolet lithography, and more particularly to the use of a multilayer buffer layer deposited intermediate a reticle substrate and a reflective coating for mitigating substrate defects in reticles.

2. Description of Related Art

Extreme ultraviolet lithography (EUVL) systems are being developed for the production of electronic components formed on wafers via reflected radiation. The EUVL systems include reticles or masks that must be essentially free of defects that will print at the wafer, thus producing defective components. The reticles, for example, may be fabricated by depositing highly reflective multilayer coatings, such as Mo/Si, on superpolished substrates. Any localized structural imperfections on the reticle substrate may nucleate and evolve during the multilayer coating process into a defect that perturbs the reflected radiation field sufficiently to print at the wafer. Thus, there has been a need for mitigating the effect of small particle contaminants on the surface of the substrate that would nucleate a defect in the reflective coating.

The reticle defect problem may be divided into two components. First, there are the defects associated with the condition of the reticle substrate. These are particles, pits, or scratches on the reticle substrate that nucleate a growth defect in the multilayer coating. Second, there are the defects that are introduced during or after the multilayer coating process, which are particle contaminants that are embedded within or are sitting on the top surface of the coating. A low defect multilayer coating technology based on ion beam sputtering has been developed so that the coatings now being deposited are essentially defect-free, thus the greater risk is the starting conditions of the reticle substrate.

Modeling has been carried out that shows imaging of growth defects nucleated by spherical particles. The results have indicated that particles as small as 25 nm in diameter will nucleate defects in multilayer coatings, which can image at the wafer. Hence, all particles of a size greater than 25 nm must be removed from the reticle substrates prior to the deposition of the reflective coating. Currently, removal of the particles from the reticle substrates is carried out by cleaning processes that are expected to be ineffective for the removal of particles of less than about 60 nm, particularly since verification that such small particles exist is difficult.

Prior efforts to resolve the reticle substrate defect problem involved a single layer buffer-layer, see K. B. Nguyen, et al., *J. Vac. Sci. Technol.* 11:2964 (1993), where a 200 nm thick single-layer amorphous silicon (a-Si) buffer-layer was deposited on the substrate prior to a Mo/Si multilayer deposition in an attempt to smooth out lithographically defined steps (defects) on a silicon surface. This resulted in some reduction in the defect height and the transition at the edges of the step was made less severe by the buffer-layer, which is advantageous. However, the surface roughness of the Si was increased significantly (from 0.2 nm to 0.7 nm), making this process impractical for EUV lithography.

Currently, there is a process having the capability of depositing a-Si approaching 200 nm in thickness with much lower roughness than that observed by Nguyen, referenced above. However, the large stress typically found in smooth, single-layer films like a-Si can limit the applicability of this single-layer approach for the buffer layer.

As an alternative to cleaning and single-layer buffer layers, the present invention mitigates the effects of these small particles by depositing a multilayer film as a buffer layer in between the substrate and the reflective coating. The purpose of this buffer layer is to reduce the perturbation of the reflective coating due to the particles, pits, or scratches on the substrate.

SUMMARY OF THE INVENTION

It is an object of the present invention to mitigate the effects of substrate defects in coated reticles used for extreme ultraviolet lithography. A further object of the invention is to provide a reticle substrate with a multilayer buffer layer to mitigate substrate defects. A further object of the invention is to provide a multilayer buffer layer between a reticle substrate and a multilayer reflective coating to mitigate the adverse effects of substrate defects. Another object of the invention is to provide a buffer layer between the substrate and a multilayer coating of a reticle utilized in extreme ultraviolet lithography.

Yet another object of the invention involves the mitigation of substrate defects in reticles for extreme ultraviolet lithography using multilayer buffer layers that are atomically smooth, have good smoothing properties, have low residual stress, and exhibit contraction during growth due to intermixing of the interfaces.

Other objects and advantages of the present invention will become apparent from the following description and accompanying drawings. The present invention is directed to mitigate the effects of particles or other defects on a reticle substrate, particularly having a size <60 nm, by depositing a multilayer film as a buffer layer between the substrate and the reflective coating. The purpose of this buffer layer is to reduce the perturbation of the reflective coatings due to the particles, pits, or scratches on the substrate. Specifically, the buffer layer is designed to smooth out the substrate topography to a point where the remaining perturbations are too small to nucleate printable growth defects in the reflective coating. The buffer multilayer is not used as a reflective coating, and thus its reflectivity to EUVL radiation need not be optimized.

The buffer layer exhibits several basic characteristics to be effective. The multilayer buffer layer provides smoothing behavior, that is, relaxation of the surface height variations due to the particles, pits and scratches on the substrate. The buffer layer also exhibits volume contraction during growth due to intermixing at the interfaces of the alternating layers. The buffer layer does not substantially increase the high spatial frequency roughness of the substrate surface (e.g., roughness is typically less than about 0.3 nm rms). The buffer layer has sufficiently low residual stress (less than about 500 MPa) so that a total buffer layer thickness of up to about 2 $\mu$m can be deposited without compromising the performance and stability of the reflective coating. Finally, the buffer layer deposition process must be clean; there must be no defects added in the process of growing the buffer multilayer.

The buffer layer may be made from materials different from the reflective coating, or from the same materials. Although the buffer layer may be made from the same materials as the reflective multilayer, the buffer layer serves a different function and is not optimized for high reflectance. The buffer layer differs structurally from the reflective coating because of the intermixing at the layer interfaces.

Multilayer materials that are atomically smooth, have good smoothing properties, have low residual stress, and exhibit contraction during growth due to intermixing at the interfaces may be used as the buffer layer. Multilayer systems that satisfy the above-listed buffer layer requirements include ion beam sputtered (IBS) molybdenum-silicon (Mo/Si) and MoRu/Be multilayer films. Other potential buffer layer multilayer materials that demonstrate the above-listed characteristics include Me/Si, Me/Be, Me/B, Me/B$_4$C, and Me/C, where Me is a metal or alloy such as Mo, W, Ni, Cr, Ru, Rh, MoRu, or MoRh.

In the present invention, the multilayer buffer layer is deposited using an ultraclean ion beam sputtering process so that no defects are added in the deposition step. The multilayer buffer layer is deposited with minimal surface roughness and residual stress so that it does not compromise the performance of the reflective multilayer coating deposited on top of the buffer layer. The ion beam tool can also be used to deposit the overlying reflective coating.

There is a strong commercial driving force for increased miniaturization in electronic devices, and EUVL systems have significant potential provided that a critical element thereof, the reflective multilayer reticle, is nearly defect-free. Thus, the present invention has the potential to make such a system commercially viable.

BRIEF DESCRIPTION OF THE DRAWINGS

The accompanying drawings, which are incorporated into and form a part of the disclosure, graphically illustrate the invention and results produced thereby and, together with the description, serve to explain the principles of the invention.

DETAILED DESCRIPTION OF THE INVENTION

Figure 1:
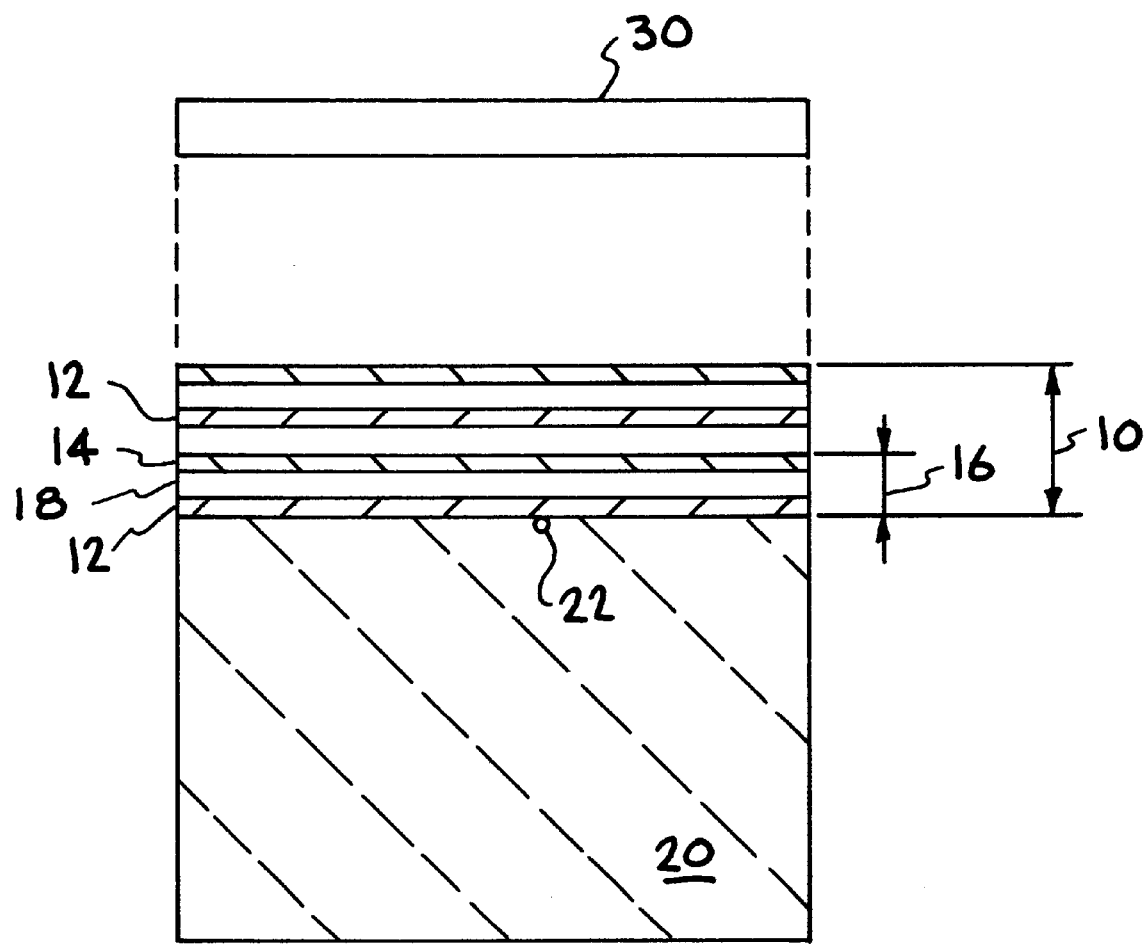
FIG. 1 shows a multilayer buffer layer on a reticle according to the present invention.

The present invention is directed to the mitigation of substrate defects in reticles or masks for extreme ultraviolet lithography (EUVL) using multilayer buffer layers. As shown in FIG. 1, a multilayer film is deposited as a buffer layer 10 on a reticle substrate 20 to cover defects 22, such as small particle contaminants, pits, or scratches in the surface. The buffer layer 10 comprises a multilayer of at least a pair 16 (bilayer) of alternating layers 12,14. Typically many pairs 16, as shown, comprise the multilayer buffer layer 10. The multilayer could comprise a plurality of trilayers or quadlayers, although bilayers are most typical. The buffer layer 10 is deposited on the reticle substrate 20 prior to deposition of a reflective coating 30. The reflective coating may be a single layer, or a multilayer. Reflective coatings for EUV lithography are well known in the art.

The multilayer buffer layer is atomically smooth and has good smoothing properties and low residual stress. The buffer layer 10 also exhibits volume contraction during growth due to intermixing at the interfaces of the layers 12,14. This intermixing creates an interlayer 18 between the layers 12,14, formed of a mixture of the two materials. The layers 12,14 are comprised of two or more elements or alloys, such as Mo/Si or MoRu/Be. Multilayer films that should demonstrate the above-referenced characteristics include Me/Si, Me/Be, Me/B, Me/B$_4$C, and Me/C, where Me is a metal or alloy such as Mo, W, Ni, Cr, Ru, Rh, MoRu, or MoRh.

The multilayer buffer layer is deposited using an ultra-clean ion beam sputtering process so that no defects are added in the fabrication operation. The multilayer buffer layer is deposited with minimal surface roughness (preferably <3 Å RMS) and low residual stress (<500 MPa) so that it does not compromise the performance of the reflective coating deposited on top of the buffer layer.

Significant smoothing of small particles coated with Mo/Si multilayer films has been observed when deposited at near-normal incidence via a low particulate ion beam sputtering process. The nature of the smoothing process consists of both a reduction of the maximum height of the defect and a reduction of the volume of the defect. The reduction in defect height is controlled by surface relaxation during the film growth process, and the reduction in defect volume is controlled by the degree of intermixing of the materials (e.g., Mo and Si) at the multilayer interfaces. In addition, computer simulations of Mo/Si multilayer film growth show that intermixing and surface relaxation can be optimized to mitigate defects at least as large as 60 nm.

A modified version of a linear continuum growth model applied to multilayer film growth was used in computer simulations. See D. G. Stearns, *Appl. Phys. Lett.* 62:1745 (1993), which is incorporated herein by reference, in which the model used parameters such as v, which characterizes the relaxation process, and n, which is a growth exponent and depends on the kinetic mechanism dominating the smoothing process. In the modified version of the Stearns growth model, a new parameter $\delta\Lambda$ was introduced, which is the contraction in the bilayer period thickness due to the intermixing of the bilayer materials (e.g., Mo, Si) at the multilayer interfaces. This modified model accounts for the ability of multilayer films deposited on small particles or defects to reduce the defect volume.

Figure 2:
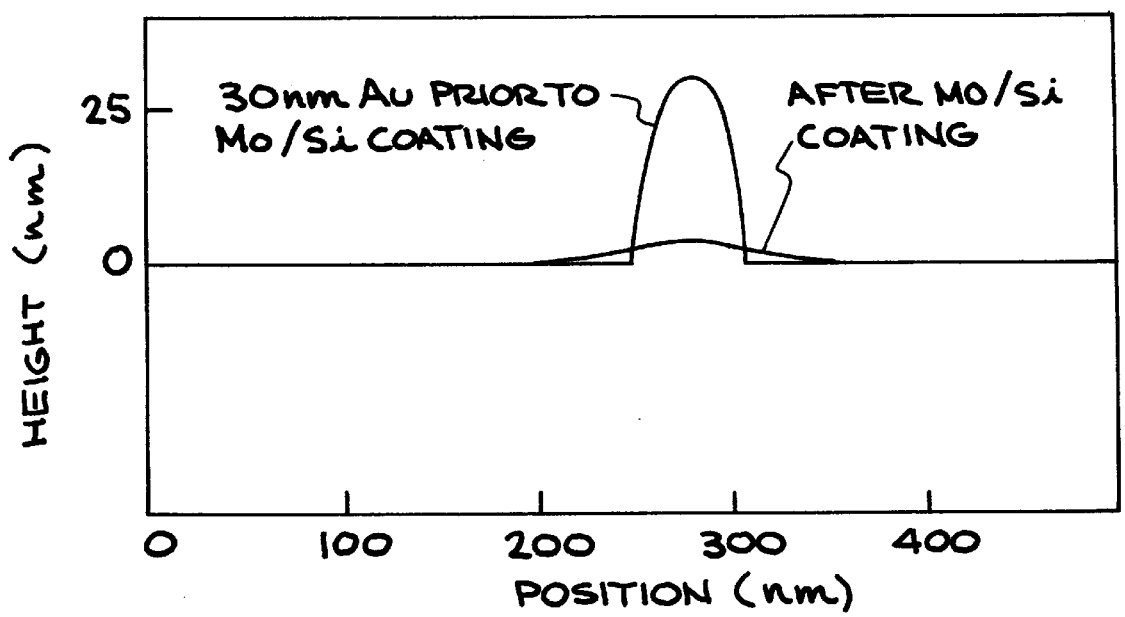
FIG. 2 graphically illustrates measurements of the surface of 30 nm diameter gold sphere before and after being coated at near-normal incidence with a Mo/Si multilayer coating.
Figure 3:
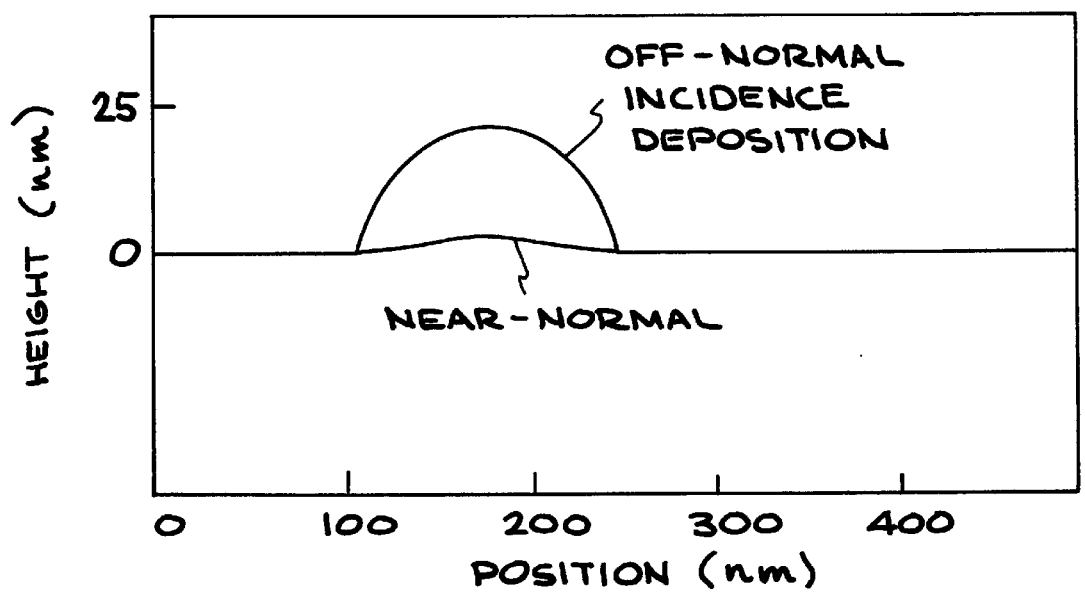
FIG. 3 graphically illustrates measurements of the gold sphere of FIG. 1 of the surface for Mo/Si deposited with the flux near-normal and off-normal.

The significant smoothing of small particles coated with Mo/Si multilayer films is illustrated in FIG. 2. For example, particles with diameters of 30–60 nm that are coated with Mo/Si films produce bumps at the surface of only 3–12 nm in height, and the defect volume is also reduced. These results are for ion beam sputtering in which the deposition flux is arriving at the substrate close to normal incidence (near-normal). For off-normal incidence, ion beam sputtering, or magnetron sputtering (which can have significant off-normal flux components), the resulting bumps at the surface can actually increase in size; this is illustrated in FIG. 3. Thus, near-normal incidence ion beam sputtered Mo/Si multilayer films are viable candidates for use as smoothing buffer layers.

Figure 4:
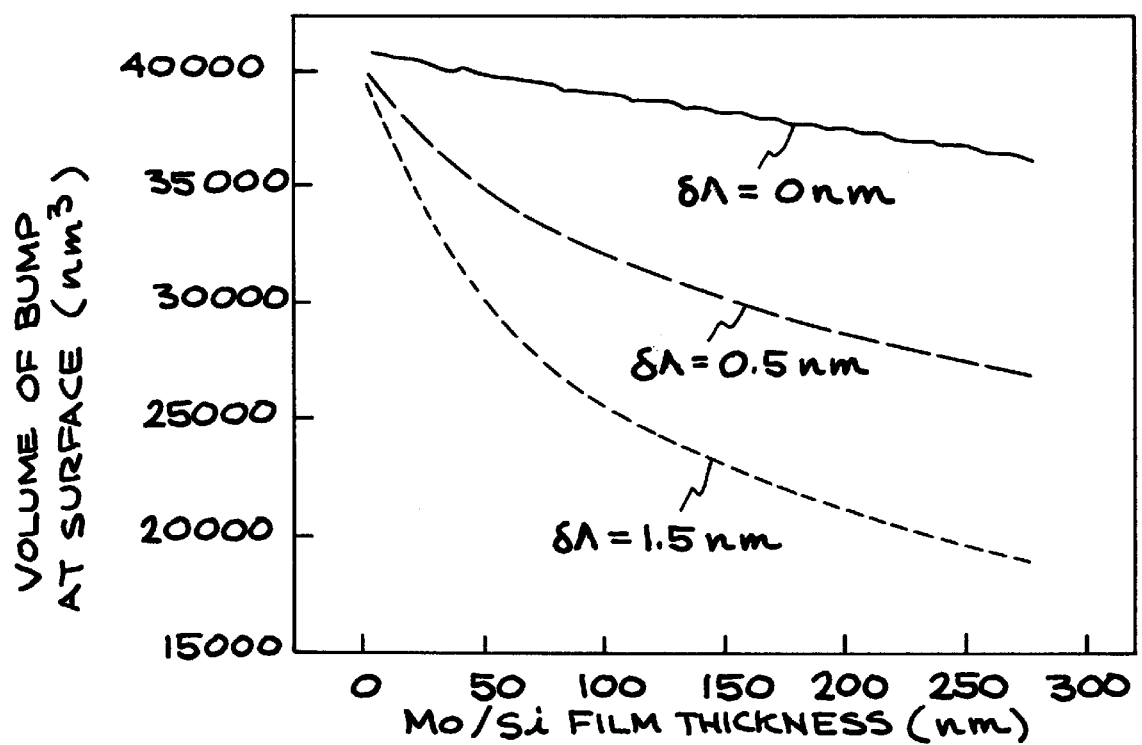
FIG. 4 graphically illustrates computer simulations of Mo/Si deposited on a 40 nm sphere showing the volumes of the bump at surface as a function of the film thickness.

The reduction in defect height is controlled by surface relaxation during the film growth process, and the reduction in defect volume is controlled by the intermixing at the multilayer interfaces, when there is concomitant bilayer contraction, $\delta\Lambda$. FIG. 4 shows that with increasing Mo/Si film thickness, the defect volume (as measured by the volume of the bump at the surface) is reduced, and that this reduction is much greater with increased intermixing. (Note that a single-layer buffer layer film could not have the effect of reducing the volume of the defect due to intermixing.) Methods to increase the amount of intermixing and thereby decrease the defect volume include: (1) using a secondary ion source directed at the growing film, (2) changing the bilayer period thickness and/or the ratio of elements in the multilayers (e.g., Mo:Si in Mo/Si multilayers), (3) annealing during and/or after multilayer deposition, (4) changing the deposition system operating pressure, or (5) varying other conditions to alter the energetics of the deposition process.

Figure 5:
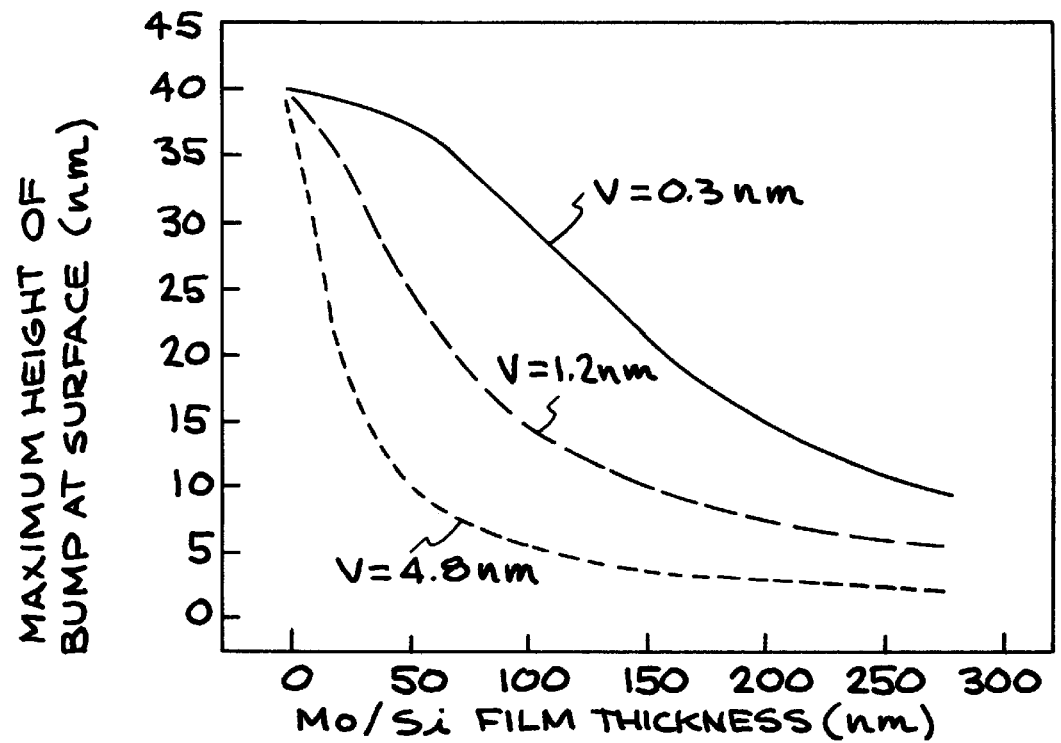
FIG. 5 graphically illustrates computer simulations showing the maximum height of the bump at surface as a function of the film thickness.

Surface relaxation can also be increased in the buffer layer deposition process to reduce the defect height. FIG. 5 shows that with increasing Mo/Si film thickness, the defect height (i.e., the maximum height of the bump at the surface) is reduced, and that this reduction is much greater as the surface relaxation (v) is increased. Increased v could be achieved by all of the methods mentioned above for increasing intermixing except for (2).

As pointed out above, there are two mechanisms that suppress the perturbation: the relaxation of the surface that removes high frequency components in the surface topography, and the intermixing at the layer interfaces, with a concomitant contraction of the bilayer thickness, which reduces the volume of the defect. By mapping out the effect of the multilayer film growth parameters on the structure of the resulting growth defects, one can design a buffer layer that sufficiently smoothes out the particles on the substrate so that the remaining perturbations (hillocks) at the surface of the buffer layer are too small to nucleate printable growth defects in the reflective multilayer coating.

A large number of multilayer growth simulations were performed to study the structure of growth defects nucleated by spherical particles having diameters of 20, 40, and 60 nm. The relaxation parameter v and the bilayer contraction $\delta\Lambda$ were varied, since these should be adjustable in practice by changing the energetics of the deposition process. The growth exponent was fixed at n=2, consistent with the value obtained experimentally for IBS deposition of Mo/Si multilayers. The nominal structure of the buffer multilayer was chosen to be [Mo(2.6 nm)/Si (4.4 nm)]×40 layers, which has $\Gamma$=0.375 to allow a maximum bilayer contraction when the layers are completely intermixed.

The effectiveness of the buffer layer in smoothing over a 40 nm diameter particle was plotted with the maximum height and volume of the perturbation at the surface of the buffer layer for a relaxation parameter of v=1.2 nm and different values of the bilayer contraction $\delta\Lambda$. Both the height and volume of the defect are reduced by increasing $\delta\Lambda$ to an optimum value of 1.5 nm; the maximum height decreased from an initial value of 40 nm to 5.3 nm and the volume decreased from an initial value of 42000 nm$^3$ to 23000 nm$^3$. As the bilayer contraction is increased towards the maximum value of 2.31 nm (corresponding to complete intermixing of the multilayer), the beneficial effects of intermixing disappear and the height and volume return to the values found for no intermixing ($\delta\Lambda$=0 nm). This is due to the saturation of the contraction mechanism; when the bilayer is completely intermixed, the reduction in the surface height is the same everywhere, independent of the topography.

Next, the relaxation parameter v was varied while keeping the bilayer contraction fixed at the optimum value of $\delta\Lambda$=1.5 nm. The variation in the maximum height and volume of the buffer layer was plotted for a 40 nm diameter particle. The relaxation parameter has opposite effects on the height and volume of the resulting perturbation. Increasing v reduces the maximum height of the surface, whereas decreasing v reduces the volume. This behavior is due to the effects of intermixing. When v is small, the perturbation remains localized and the surface slope is larger, thereby allowing the intermixing to be more effective in reducing the volume of the perturbation. When v is large, there is more smoothing of the perturbation, which reduces the height of the defect, but also decreases the surface slope and hence suppresses the volume reduction due to intermixing. The important point is that by varying v, the structure of the perturbation is changed in very different ways.

From the standpoint of printability, the most important information is the structure of the growth defect at the top of the reflective coating. To address this issue, simulations were performed in which a reflective multilayer coating was grown on top of the buffer layer. The structure of the reflecting multilayer was [Mo(2.8 nm)/Si(4.2 nm)]×40, corresponding to a standard high performance optical coating. For the reflective coating, the growth parameters found experimentally of v=1.2 nm, n=2 and $\delta\Lambda$=0.82 nm were used. The results for an initial particle size of 40 nm diameter were plotted. The defect structure is defined by the maximum height and volume of the surface perturbation at the top surface of the reflective coating. The shape of the perturbation was always found to be a Guassian of revolution. It is apparent that the application of a Mo/Si buffer multilayer can significantly modify the structure of the resulting growth defects. The best simultaneous reduction in the height and volume of the defect was obtained using a contraction of $\delta\Lambda$=1.5 nm and the smallest possible value of v (0.3). However, smaller maximum height can be achieved at the expense of larger volume by applying very large values of v. Ultimately, the choice is determined by the printability of these various defect structures.

The effect of buffer layers or growth defects nucleated by 20 and 60 nm diameter spherical particles were also determined. The relative decrease in the height and volume of the defects produced by the buffer layer are found to be independent of the particle size. The greatest challenge is to suppress the formation of defects from the largest particles, that is, in the 60 nm diameter range. The results indicate that the Mo/Si buffer layer will be able to reduce the maximum height of the defect to within the range of 3–6 nm and reduce the volume by as much as a factor of four. Larger reductions are possible with thicker buffer layers; however, the thickness is primarily limited by the residual stress of the film.

Two important issues impacting the viability of buffer layers are the accumulated roughness and the residual stress of the buffer layer. The rms roughness was calculated for different values of v using the experimentally determined growth unit volume of $\Omega$=0.055 nm$^3$ and growth exponent of n=2. The reticle substrate was assumed to be perfectly smooth. In these calculations, the rms roughness was found by integrating the power spectral density over the frequency range of $10^{-6}$–1 nm$^{-1}$. The results are a function of the buffer layer thickness. It is evident that the roughness increases with decreasing values of v. However, even for the smallest value of v=0.3 nm, the rms roughness at the top surface of the buffer layer is only 0.26 nm. This amount of roughness will decrease the reflectivity of the reticle by approximately 3%. In some cases, a larger decrease in reflectivity may be acceptable, and thus a greater amount of roughness could also be tolerated.

The amount of acceptable residual stress in the buffer layer is determined by how much stress the reticle substrate can tolerate and what amount of stress causes delamination of the buffer layer and overlying reflective layer. For example, it is well documented that the residual stress can be large in Mo/Si multilayer coatings; the typical stress for a magnetron sputtered Mo/Si reflective coating having 40 bilayers is~−400 MPa. The stress in the buffer layer and for the total thickness (buffer layer+reflective layer) must be below the threshold that causes the layers to flake off or delaminate.

A simple implementation of a buffer layer is the use of a 40-bilayer Mo/Si multilayer coating. This buffer layer reduces the maximum height of the growth defect by over a factor of two for all particle sizes and also yields a ~25% reduction in the volume. A significant decrease in the defect size can be obtained by adjusting the growth parameters of the buffer layer. In particular, it is important to be able to independently control the bilayer contraction $\delta\Lambda$ and the relaxation parameter v. Then the contraction can be set to the optimum value of $\delta\Lambda=1.5$ nm, and v can be adjusted to minimize either the height or the volume of the defect. Note that the structure of the buffer layer is not optimized for high EUV reflectance; the reflective coating is so optimized.

To independently adjust the growth parameters $\delta\Lambda$ and v, the power deposited at the film growth surface must be precisely controlled. Specifically, it is necessary to decouple the transport of the effluent (e.g., Mo and Si atoms) and the transport of energy to the growth surface. This can be achieved by using two ion beam sources: one to sputter the target material (e.g., Mo and Si atoms) onto the substrate, and a second ion source (e.g., argon) directly incident on the substrate to heat the growth surface. The film deposition should be performed at relatively high pressure (~1 mT) in order to minimize the energy of the incoming atoms and Ar neutrals reflected from the target. Then the energy flux at the growth surface will be determined primarily by the direct ion bombardment.

The growth behavior of multilayer films can be significantly modified by ion bombardment, or ion-assisted deposition. A current density of 75 $\mu A/cm^2$ at 300 V is sufficient to produce complete intermixing of Mo and Si layers. Lower voltages (~100 V) increase the surface relaxation (larger v) with much less intermixing. Thus, direct ion bombardment of the growth surface can be used to control both the bilayer contraction $\delta\Lambda$ and the relaxation parameter v. A specific amount of intermixing can be obtained by applying a large energy flux for a short period during the transition between layers, that is, at the multilayer interfaces. The relaxation parameter v can be adjusted by applying a lower energy ion flux to the growth surface thoughout the deposition of the multilayer.

The application of a second ion source must be compatible with the defect-free deposition technology required for reticle production. The current technology is based on ion beam sputtering, so the use of a second ion source should not be problematic. However, direct ion bombardment of the substrate is a fundamentally different process from the perspective of particle management. Particles generated within the plasma of the ion gun or knocked off grids could be directly deposited onto the substrate, and management of such particle generation would be required.

Another example of a smoothing buffer layer is MoRu/Be. Although these layers do not intermix as much as the interfaces of Mo/Si, there are other potential advantages. MoRu/Be has a very low residual stress, which permits much thicker films to be deposited without reticle bending or film delamination. Also, this buffer layer can be grown very thick while retaining its surface smoothness. The net smoothing effect is generally expected to increase with increasing buffer layer thickness, and therefore a thick MoRu/Be multilayer film is a viable buffer layer candidate. MoRu/Be multilayer films up to 1500 nm thick have been deposited with stress values of approximately 13 MPa and surface roughness values of approximately 0.15 nm rms. The relaxation parameter for MoRu/Be multilayer film growth can be adjusted in a similar manner as mentioned above for Mo/Si multilayer film growth to provide more beneficial smoothing effects.

The present invention mitigates the problem associated with defects on the surface of a reflective reticle, and effectively reduces the perturbation resulting from defects having a height of up to at least about 60 nm. By use of the multilayer buffer layer intermediate the reticle substrate and the reflective coating, and by controlling the deposition of the buffer layer, localized structural imperfections on the reticle substrate do not produce imperfections in a reflective multilayer coating that perturb the reflected radiation field sufficiently to print at the wafer. This invention is particularly applicable for producing near-defect free reticles required for EUVL systems, thereby enabling the EUVL technology to be commercially viable.

The foregoing description of preferred embodiments of the invention is presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated.

What is claimed is:

1. A device used in lithography, comprising:
   a reticle substrate; and
   a buffer layer deposited on the substrate that mitigates adverse effects resulting from defects on the reticle substrate, wherein the buffer layer comprises a plurality of layers.

2. A device as recited in claim 1, wherein the buffer layer further comprises an interlayer between two adjacent layers, wherein the interlayer is formed of a mixture of the materials of the two adjacent layers.

3. A device as recited in claim 2, wherein the buffer layer comprises materials selected from the group consisting of Me/Si, Me/Be, Me/B, Me/B$_4$C, and Me/C, where Me is a metal or alloy selected from the group consisting of Mo, W, Ni, Cr, Ru, Rh, MoRu, and MoRh.

4. A device as recited in claim 1, wherein the buffer layer has a smoothness of less than about 0.3 nm rms.

5. A device as recited in claim 1, wherein the buffer layer has a residual stress of less than about 500 MPa.

6. A device as recited in claim 1, wherein the buffer layer has a thickness of up to about two microns.

7. A device as recited in claim 1, further comprising a reflective coating deposited on the buffer layer.

8. A device as recited in claim 7, wherein the buffer layer further comprises an interlayer between two adjacent layers, wherein the interlayer is formed of a mixture of the materials of the two layers, and wherein the reflective coating comprises at least two layers and an interlayer between the two layers, and the buffer layer interlayer has a greater thickness than the reflective coating interlayer.

9. A device as recited in claim 7, wherein the buffer layer comprises at least one material that is different from the reflective coating.

10. A device as recited in claim 7, wherein the buffer layer comprises the same materials as the reflective coating.

11. A method for mitigating substrate defects in reticles for extreme ultraviolet lithography, comprising:

providing a reticle substrate; and depositing a buffer layer on the reticle substrate for reducing the effect of defects on the reticle substrate, wherein the buffer layer comprises a plurality of layers.

12. A method as recited in claim 11, further comprising depositing a reflective coating on the buffer layer.

13. A method as recited in claim 12, wherein depositing the buffer layer and depositing the reflective coating are carried out using the same materials.

14. A method as recited in claim 13, wherein depositing the buffer layer and depositing the reflective coating are carried out using different growth parameters for each of the buffer layer and the reflective coating.

15. A method as recited in claim 12, wherein depositing the buffer layer and depositing the reflective coating are carried out using at least one different material.

16. A method as recited in claim 12, wherein depositing the buffer layer includes forming an interlayer between and at the interface of the layers, wherein the interlayer is formed of a mixture of the materials of the adjacent layers, and wherein depositing the reflective coating includes forming at least two layers and an interlayer between the two layers, and wherein the buffer layer interlayer has a greater thickness than the reflective coating interlayer.

17. A method as recited in claim 11, wherein depositing the buffer layer includes forming an interlayer between and at the interface of the layers, wherein the interlayer is formed of a mixture of the materials of the adjacent layers.

18. A method as recited in claim 17, wherein depositing the buffer layer is carried out by controlling the intermixing of the materials at the interlayers.

19. A method as recited in claim 11, wherein depositing the buffer layer is carried out by controlling the surface relaxation during growth of the buffer layer.

20. A method as recited in claim 11, wherein depositing the buffer layer is carried out by ion beam sputtering.

21. A method as recited in claim 20, wherein depositing the buffer layer is carried out by additionally using a secondary ion source.

22. A method as recited in claim 21, wherein depositing the buffer layer is carried out by bombarding the buffer layer surface using a secondary ion source during the growth of the buffer layer.

23. A method as recited in claim 22, wherein depositing the buffer layer includes forming an interlayer between and at the interface of adjacent layers, wherein the interlayer is formed of a mixture of the materials of the adjacent layers, and wherein depositing the buffer layer is carried out by bombarding the buffer layer surface using a secondary ion source during the growth of the interlayers of the buffer layer.

24. A method as recited in claim 11, wherein depositing the buffer layer is carried out using materials selected from the group consisting of Me/Si, Me/Be, Me/B, Me/$B_4$C, and Me/C, where Me is selected from the group of metals or alloys consisting of Mo, W, Ni, Cr, Ru, Rh, MoRu, and MoRh.

25. A method as recited in claim 11, further comprising annealing the buffer layer during deposition.

26. A method as recited in claim 11, further comprising annealing the buffer layer after deposition.

* * * * *